United States Patent
Lee

(10) Patent No.: US 7,335,032 B1
(45) Date of Patent: Feb. 26, 2008

(54) INTERFACE CARD SECURING DEVICE INCLUDING GROUNDING ELEMENT

(75) Inventor: Ching-Yao Lee, Taipei (TW)

(73) Assignee: T-Conn Precision Corp. (TW)

( * ) Notice: Subject to any disclaimer, the term of this patent is extended or adjusted under 35 U.S.C. 154(b) by 0 days.

(21) Appl. No.: 11/550,410

(22) Filed: Oct. 18, 2006

(51) Int. Cl.
*H01R 12/00* (2006.01)

(52) U.S. Cl. ........................ 439/76.1; 439/92

(58) Field of Classification Search .............. 439/76.1, 439/108, 95, 92, 386, 947, 945–946, 159, 439/630; 361/801, 725–727, 732, 740, 753–754, 361/796–798, 800
See application file for complete search history.

(56) References Cited

U.S. PATENT DOCUMENTS

| | | | |
|---|---|---|---|
| 6,394,817 B1 * | 5/2002 | Kihira et al. | 439/76.1 |
| 6,646,889 B2 * | 11/2003 | Sivertsen et al. | 361/801 |
| 2006/0238992 A1 * | 10/2006 | Chen | 361/801 |

* cited by examiner

*Primary Examiner*—Edwin A. Leon
(74) *Attorney, Agent, or Firm*—Morris Lin; T-Conn Precision Corp.

(57) ABSTRACT

An interface card securing device including a grounding element is disclosed. The grounding element may reduce the interference during high speed signal transmission of the interface card. The grounding element is integrally formed with the securing device as single unit using a plastic injection molding process. Thus, the assembly of the securing device is simplified, and the fabrication cost of the interface card securing device is significantly reduced, and the signal transmission quality is significantly promoted.

4 Claims, 5 Drawing Sheets

INTERFACE CARD SECURING DEVICE INCLUDING GROUNDING ELEMENT

BACKGROUND OF THE INVENTION

1. Field of the Invention

The present invention relates to an interface card securing device, and more particularly to an interface card securing device including a grounding element for reducing interference during high speed signal transmission of the interface card.

2. Description of Related Art

The advancement of technology paved way for the electronic product to be more comprehensive in order to meet market demand. The present trend of the electronic product to be thin and small occupying lesser space and high portability are common demand of users. Accordingly, the manufacturers develop the electronic products to be as compact and small as possible.

Thus, the specification and structure of the components of the computer and electronic devices are being altered and redesigned accordingly so as to provide higher operation efficiency, easy to assemble, and also smaller in size.

The securing device used for securing the interface card available on the market are available in various structures equipped with several securing schemes. As the size of the components is being reduced continuously for meeting the current trend, the structural strength of the securing device is consequently reduced and the small size of the securing device is difficult to handle.

For overcoming the above defects, the inventor of the present invention proposes an interface card securing device, which is fabricated by using a plastic injection process. Thus, the fabrication of the interface card securing device may be substantially simplified and the fabrication cost can be effectively reduced, and is suitable for mass production. Furthermore, the structural strength of the interface card securing device is adequate, and is easy to handle and assemble. According to an embodiment of the present invention, the interface card securing device comprises a grounding element for reducing interference during high speed signal transmission of the interface card.

SUMMARY OF THE INVENTION

Accordingly, the present invention provides interface card securing device comprising a grounding element. The grounding element may reduce the interference during high speed signal transmission of the interface card. Thus, the signal transmission quality may be effectively promoted. The grounding element may be integrally-formed with the interface card securing device as a single unit. Thus, the interface card securing device of the present invention is simple and easy to assemble. Furthermore, the interface card securing device may be fabricated using the mature conventional plastic injection molding process, and therefore the fabrication process of the interface card securing device is simple and the fabrication cost thereof may be effectively reduced.

BRIEF DESCRIPTION OF THE DRAWING

For a more complete understanding of the present invention, reference will now be made to the following detailed description of preferred embodiments taken in conjunction with the following accompanying drawings.

DETAIL DESCRIPTION OF THE INVENTION

Figure 1:
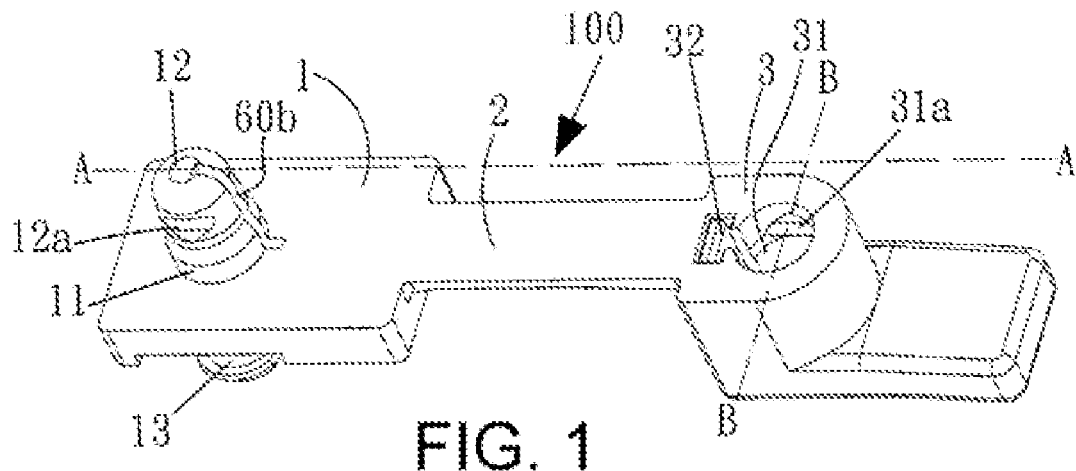
FIG. 1 is a perspective view of a housing of interface card securing device according to an embodiment of the present invention.
Figure 2:
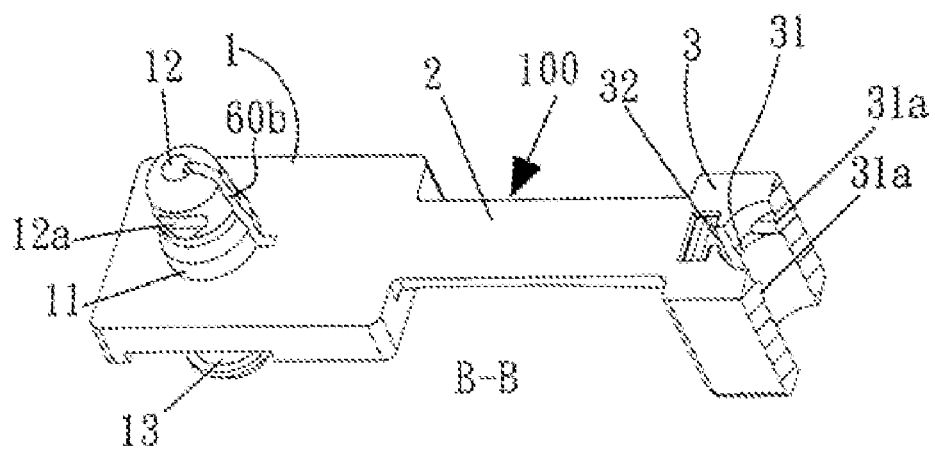
FIG. 2 is a sectional side view taken along line B-B of the interface card securing device shown in FIG. 1.
Figure 3:
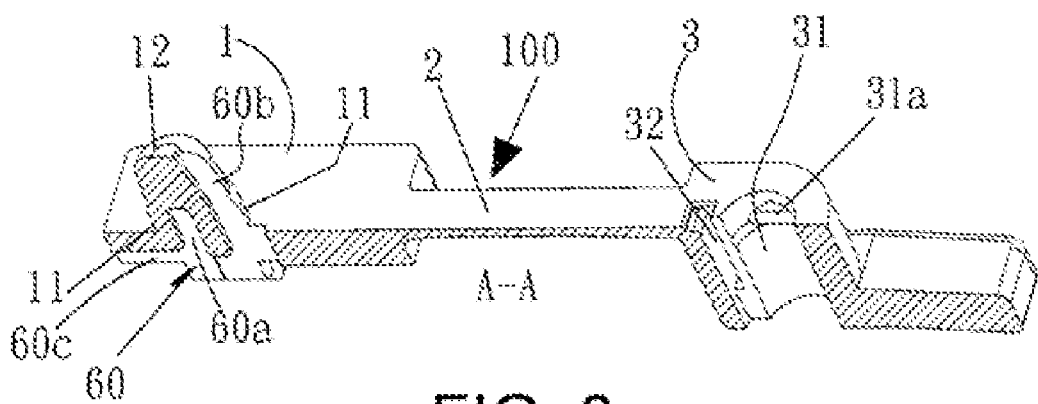
FIG. 3 is a sectional side view taken along line A-A of the interface card securing device shown in FIG. 1.

FIG. 1 shows is a perspective view of a housing of the securing device according to the embodiment of the present invention. Referring to FIG. 1, the housing 100 may be formed using a conventional plastic injection molding process. The housing 100 comprises a securing set 1, a connecting portion 2 and a string connecting stopper 3. The securing set 1 comprises sleeve 11 that protrude upward and a joint portion 12. The joint portion 12 comprises a plurality of indentations 12a at a flange of the securing set 12. A securing portion 13 with a hook may be disposed beneath the securing set 1. The securing portion 13 comprises a terminal slot 60 formed at a central portion thereof. The terminal slot 60 comprises a securing slot 60a, a movable slot 60b formed on two sides thereof and a horizontal slot 60c. The moveable slot 60b may be comprised of an opening extending from the sleeve 11 to the joint portion 12. Referring to FIGS. 2 and 3, the stopper 3 comprises a slot 31 surrounded by a plurality of protrusions 31a, and a slot 32 is formed adjacent to the slot 31.

Figure 4:
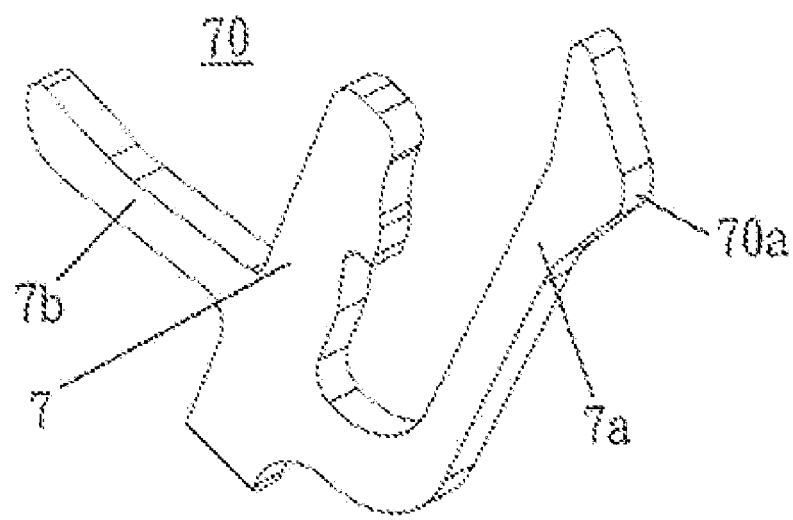
FIG. 4 is a perspective view of a grounding terminal of a grounding element for an interface card securing device according to an embodiment of the present invention.

FIG. 4 a perspective view of a grounding terminal of the grounding element for an interface card securing device according to the embodiment of the present invention. Referring to FIG. 4, the grounding terminal 70 comprises a fixing element 7 including a hook, a moveable arm 7a having a protrusion 70a formed on a front side thereof and a welding terminal 7b formed on another side thereof.

Figures 5, 5A:
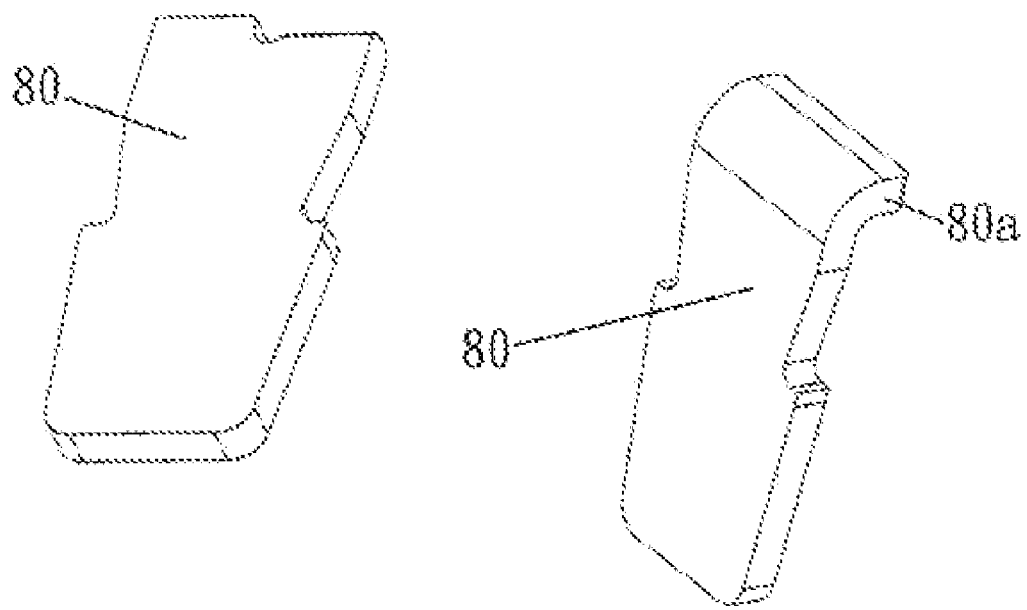
FIG. 5 is a perspective view of a grounding plate of the grounding element for an interface card securing device according to an embodiment of the present invention.
FIG. 5A is a perspective view of a grounding plate of the grounding element for an interface card securing device according to another embodiment of the present invention.

FIG. 5 is a perspective view of a grounding plate of the grounding element for an interface card securing device according to an embodiment of the present invention. Referring to FIG. 5, the grounding plate 80 is comprised of a plate having protruded hooks formed on two sides thereof, wherein the bottom portion of the grounding plate 80 (as shown in FIG. 5A) may be bent into a contacting portion 80a to increase the contact surface.

Figure 6:
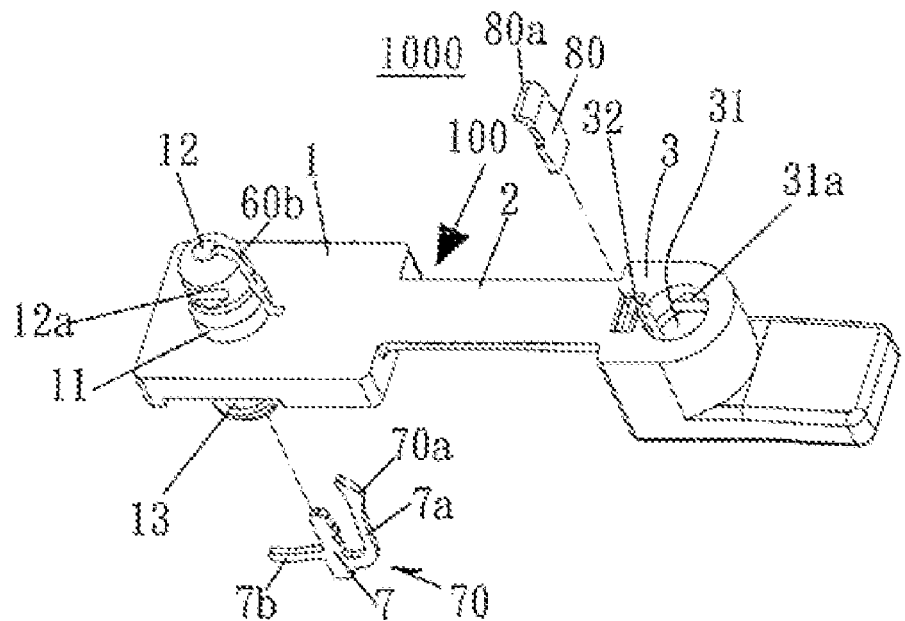
FIG. 6 is an exploded view of a grounding element for an interface card securing device according to an embodiment of the present invention.
Figure 7:
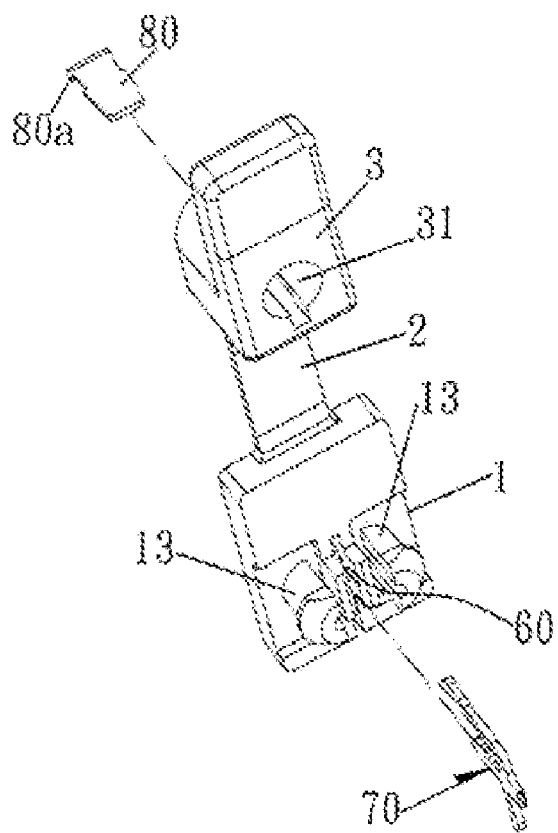
FIG. 7 is an exploded view of the grounding element for an interface card securing device according to another embodiment of the present invention.
Figure 8:
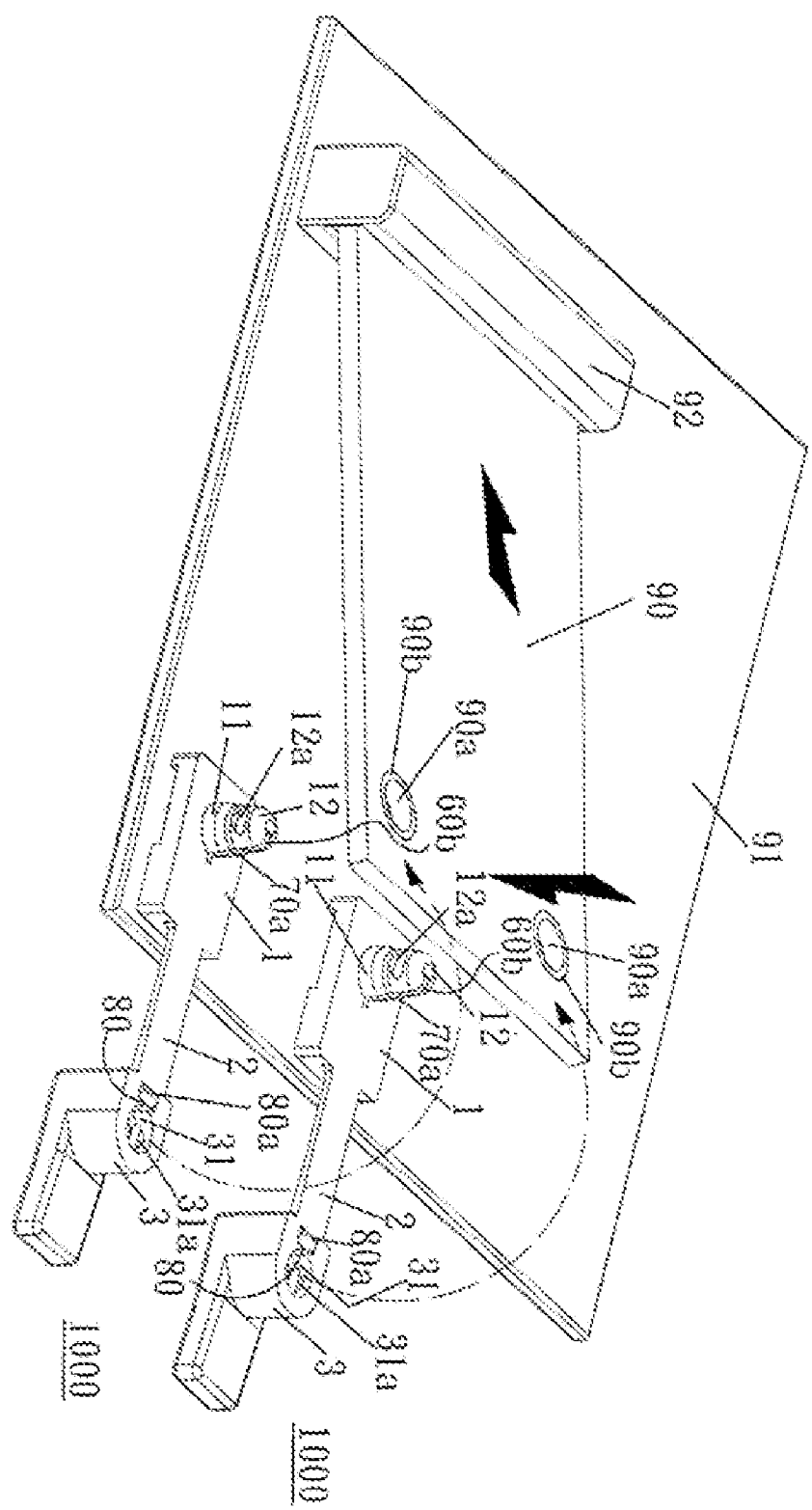
FIG. 8 is a view showing while the securing device is being assembled to a board according to an embodiment of the present invention.
Figure 9:
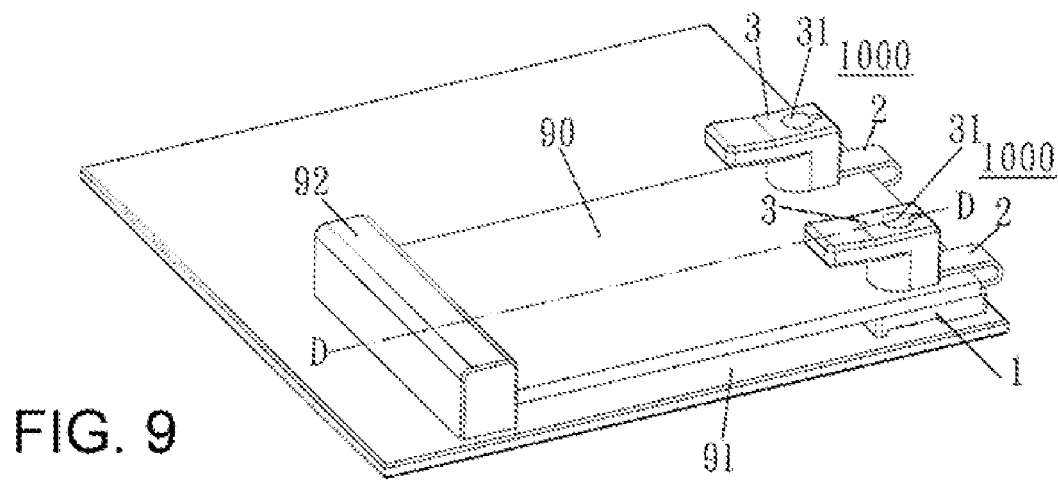
FIG. 9 is a perspective view of the interface card securing device including the grounding element according to an embodiment of the present invention.

FIGS. 6 and 7 are exploded views of a grounding element for an interface card securing device according to an embodiment of the present invention. Referring to FIGS. 6 and 7, the securing device 1000 adapts the grounding terminal 70 using the terminal slot 60 of the securing set 1 (as shown in FIGS. 8 and 9). The fixing element 7 of the grounding terminal 70 is disposed in the securing slot 60a, and the moveable arm 7a and the welding terminal 7b of the grounding terminal 70 are respectively positioned in the moveable slot 60b and horizontal slot 60c. The moveable arm 7a is moveably positioned in the moveable slot 60b, and a top portion of the protrusion 70a protrudes out of the moveable slot 60b. Furthermore, the slot 32 of the stopper 3 is used for adapting the grounding plate 80.

Figure 10:
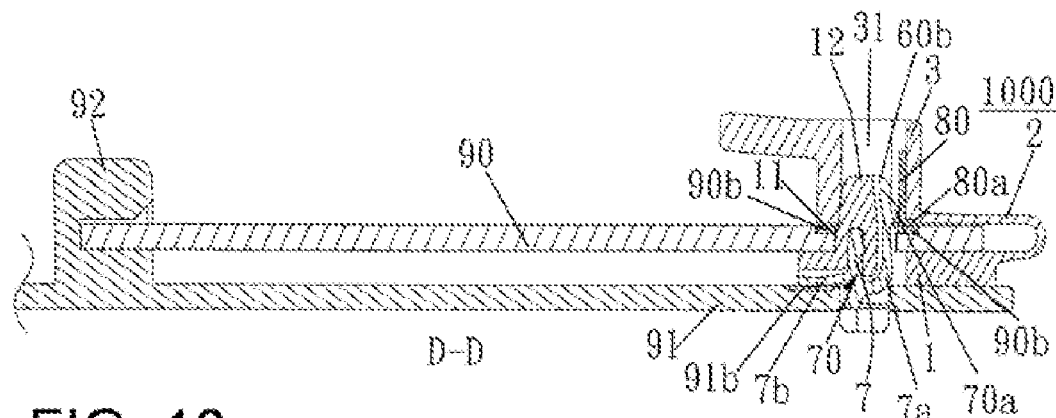
FIG. 10 is a sectional side view taken along line D-D of the interface card securing device including the grounding element shown in FIG. 9.
Figure 11:
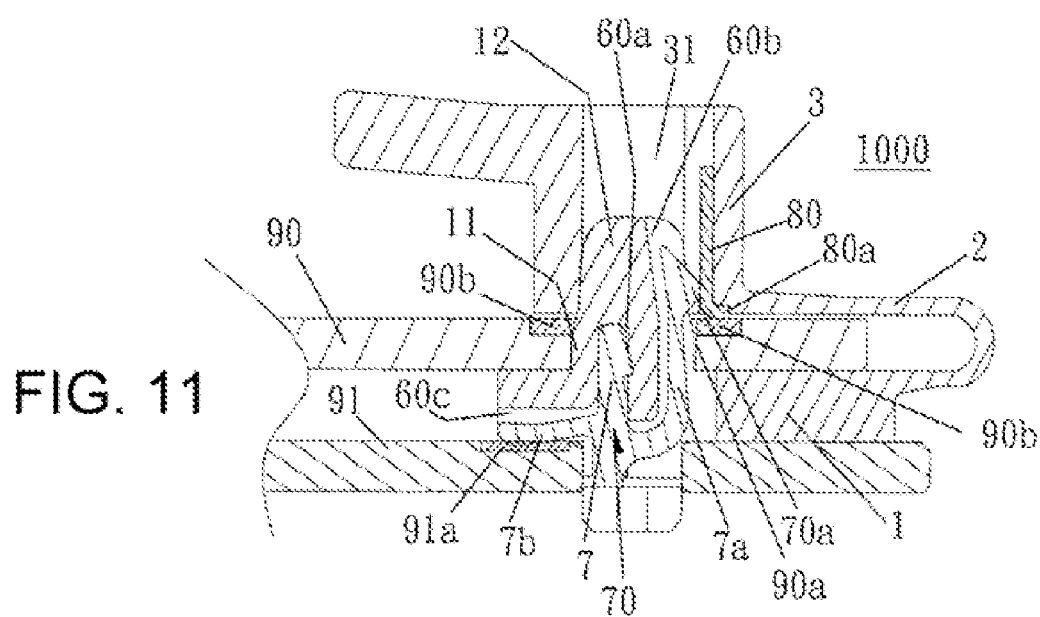
FIG. 11 is a partial sectional side view taken along line D-D of the interface card securing device including the grounding element shown in FIG. 9.

FIG. 8 is a perspective view of the interface card securing device including the grounding element according to an embodiment of the present invention. Referring to FIG. 8, the securing portion 13 of the securing device 1000 is inserted into the board 91 (as shown in FIGS. 9, 10 and 11), the grounding terminal 70 of the securing device 1000 comprises the welding terminal 7b connected to a grounding point 91a of a circuit board 91. One end of the interface card 90 is adapted by the connector 92 of the circuit board 91 and another end of the interface card 90 is pressed down to fit into the sleeve 11 of the securing device 1000. The stopper 3 of the securing device 1000 comprises the slot 31 for covering the joint portion 12. The protrusion 31a of the slot 31 is buckled to the indentation 12a of the joint portion 12 for positioning, and the top portion of the protrusion 70a of the moveable arm 7a of the grounding terminal 70 is connected to the grounding plate 80 of the stopper 3. The bottom portion (or the contacting portion 80a) of the grounding plate 80 is connected to the grounding point 90b of the interface card 90 to reduce the interference.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

| DESCRIPTION OF COMPONENT SYMBOLS IN DRAWINGS | |
|---|---|
| housing | 100 |
| sleeve | 11 |
| indentations | 12a |
| connecting portion | 2 |
| slot | 31, 90a |
| slot | 32 |
| securing slot | 60a |
| horizontal slot | 60c |
| moveable arm | 7a |
| grounding terminal | 70 |
| grounding plate | 80 |
| interface card | 90 |
| board | 91 |
| securing device | 1000 |
| securing set | 1 |
| joint portion | 12 |
| securing portion | 13 |
| stopper | 3 |

| -continued | |
|---|---|
| DESCRIPTION OF COMPONENT SYMBOLS IN DRAWINGS | |
| protrusion | 31a |
| terminal slot | 60 |
| movable slot | 60b |
| fixing element | 7 |
| welding terminal | 7b |
| protrusion | 70a |
| contacting portion | 80a |
| grounding point | 90b, 91a |
| connector | 92 |

| DESCRIPTION OF MAJOR COMPONENT SYMBOLS Assigned Major Diagram: FIG. 11 | |
|---|---|
| securing set | 1 |
| sleeve | 11 |
| joint portion | 12 |
| connecting portion | 2 |
| stopper | 3 |
| slot | 31, 90a |
| securing slot | 60a |
| movable slot | 60b |
| horizontal slot | 60c |
| fixing element | 7 |
| moveable arm | 7a |
| welding terminal | 7b |
| grounding terminal | 70 |
| protrusion | 70a |
| grounding plate | 80 |
| contacting portion | 80a |
| interface card | 90 |
| grounding point | 90b, 91a |
| board | 91 |
| securing device | 1000 |

What is claimed is:

1. An interface card securing device including a grounding element, comprising:
 a housing, comprising:
 a securing set, a connecting portion and a string connecting stopper, wherein said securing set comprises:
  a sleeve;
  a joint portion, comprising a plurality of indentations formed on a flange thereof; and
  a securing portion, comprising a hook formed on a bottom portion thereof, a terminal slot formed on a central portion thereof, wherein the terminal slot comprises a securing slot, a movable slot formed on two sides thereof and a horizontal slot, and wherein said moveable slot is comprised of an opening extending from said sleeve to said jointing portion; and
 said connecting stopper comprises:
  a slot, surrounded by a plurality of protrusions;
 a fixing element, comprising a hook with a moveable arm including a protrusion formed on a front side thereof, and a welding terminal formed on another side thereof;
 a grounding plate, being connected to said grounding terminal and formed on a plate having protruding hooks formed on two sides thereof, wherein said terminal slot of said securing portion of said housing is used for adapting said grounding terminal, and said fixing element of said grounding terminal is fixed into said slot of said connecting stopper, said moveable arm and welding terminal of said fixing element are respectively positioned in said moveable slot and horizontal slot respectively, and wherein said moveable arm is moveably positioned in said moveable slot, and a top portion of the protrusion protrudes out of said opening of moveable slot.

2. The interface card securing device including a grounding element according to claim 1, wherein said securing portion of said securing set is fixed on a circuit board, and said welding terminal of said fixing element is connected to a grounding point of said circuit board, wherein one end of the interface card fits into the sleeve of the securing set, said string connecting stopper of the securing set comprises a slot for covering the joint portion and a protrusion of said slot is buckled to said indentation of said joint portion, and a top portion of said moveable arm is connected to said grounding plate and a bottom portion of said grounding plate is connected to said grounding point of said interface card.

3. The interface card securing device including a grounding element according to claim 1, wherein said hooks contact a top portion of said moveable arm, and a bottom portion of said hooks contact said grounding point of said interface card.

4. The interface card securing device including a grounding element according to claim 1, wherein a bottom portion of said grounding plate is bent into a contacting portion to increase a contact surface thereof.

* * * * *